United States Patent [19]

Hilton

[11] 4,085,352

[45] Apr. 18, 1978

[54] DIGITAL WAVEFORM ANALYZER

[76] Inventor: Richard Dickson Hilton, Rte. 2, Box 381-A, King George, Va. 22485

[21] Appl. No.: 731,169

[22] Filed: Oct. 12, 1976

[51] Int. Cl.² .......................... G08B 5/36; H04N 3/14
[52] U.S. Cl. .......................... 315/169 R; 315/169 TV; 324/121 R; 340/166 EL; 340/324 M; 358/241
[58] Field of Search .................... 340/324 M, 166 EL; 315/169 TV, 169 R; 358/241; 324/121 R, 96

[56] References Cited

U.S. PATENT DOCUMENTS

| | | | |
|---|---|---|---|
| 3,309,610 | 3/1967 | Yamamoto | 315/169 R |
| 3,622,697 | 11/1971 | Metzger | 358/241 |
| 3,863,221 | 1/1975 | Kaji | 340/324 M |
| 3,872,386 | 3/1975 | Luhowy | 324/96 |
| 3,896,375 | 7/1975 | Trolliet | 324/121 R |
| 3,946,378 | 3/1976 | Hahn et al. | 340/324 M |
| 4,004,220 | 1/1977 | Kerber et al. | 324/103 P |

Primary Examiner—Howard A. Birmiel

[57] ABSTRACT

The Digital Waveform Analyzer is a solid state highly portable device that approximates the operation of a cathode ray oscilloscope in time sweep mode by selectively lighting elements of a rectangular matrix of light emitting diodes. The LED array has its rows driven by a vertical circuit and its columns driven by a horizontal circuit. The vertical circuit converts the analog input signal to a "one-of-N" digital code. The converter utilizes an array of comparators and exclusive OR gates and does not require clocking. The horizontal circuit which corresponds to the sweep section of a standard cathode ray oscilloscope has a variable frequency clock generator, a binary counter, a decoder and synchronizing circuits.

6 Claims, 4 Drawing Figures

DIGITAL WAVEFORM ANALYZER

STATEMENT OF GOVERNMENT INTEREST

The invention described herein may be manufactured and used by or for the Government of the United States of America for governmental purposes without the payment of any royalties thereon or therefor.

BACKGROUND

Relatively bulky and expensive cathode ray oscilloscopes are in general use. While these devices are capable of displaying large amounts of information, frequently their full capabilities are not needed all of the time by repairmen.

SUMMARY

The Digital Waveform Analyzer is a device wherein the time-domain display of a waveform is presented on a matrix of light emitting diodes.

The Digital Waveform Analyzer is a solid state highly portable device that approximates the operation of a cathode ray oscilloscope in time sweep mode by selectively lighting elements of a M column-N row matrix of light emitting diodes. The LED array has its rows driven by a vertical circuit and its columns driven by a horizontal circuit. The LED corresponding to the driven row and the driven column will light. The vertical circuit converts the analog input signal to a "one-of-N" digital code while the horizontal circuit utilizes a one-of-M digital code to effect a horizontal sweeping action.

Advantages of this invention over a cathode ray oscilloscope are its small size and low power requirements. Pocket size instruments are easily fabricated. Also, the digital nature of the sweep circuit means that this normally expensive part of an oscilloscope can be fabricated of inexpensive digital circuits.

DETAILED DESCRIPTION OF THE PREFERRED EMBODIMENT

Figure 1:
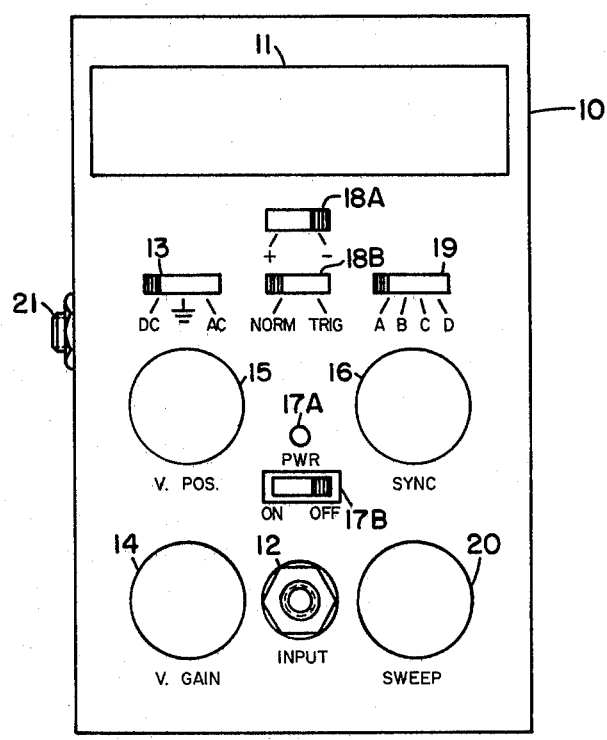
FIG. 1 is a view of the front panel of the Digital Waveform Analyzer.
Figure 2:
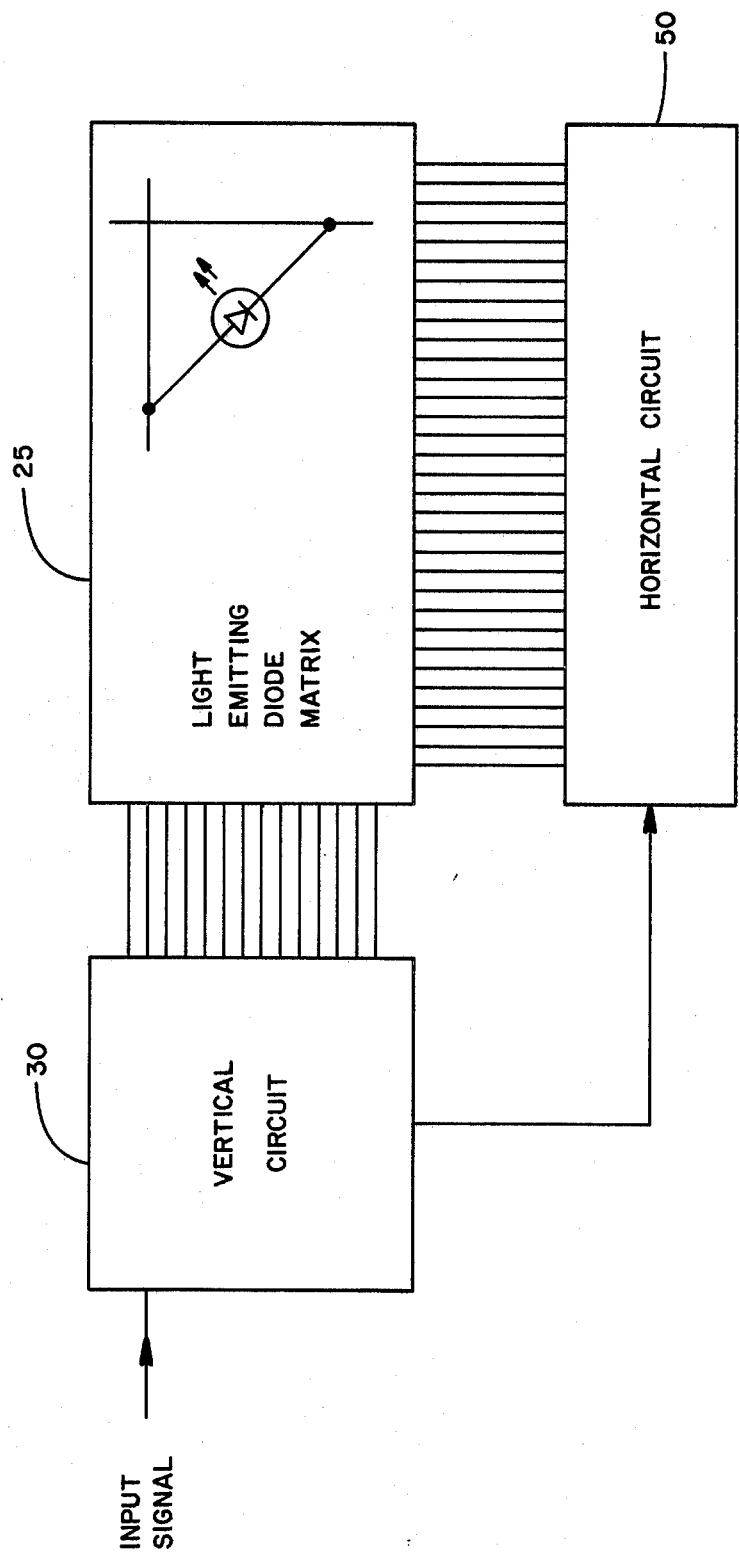
FIG. 2 is a block diagram of the circuitry in the Digital Waveform Analyzer.

The Digital Waveform Analyzer is a solid state device wherein the time-domain display of a waveform is presented on a matrix of light emitting diodes (LEDs). FIG. 1 is a view of the front panel 10 of the analyzer while FIG. 2 is a block diagram of the circuitry therein depicting the LED array 25 which has its rows driven by the vertical circuit 30 and its columns driven by the horizontal circuit 50.

In the preferred embodiment a matrix 25 of Monsanto MV-5082 red diodes in an array of fourteen rows and thirty-two columns is used. These four hundred forty-eight discrete devices are arranged on a PC board forming a viewing area 11 about 1¼ inches by 2¾ inches. (FIG. 1) The LED matrix 25 can be any number of rows and columns with the vertical 30 and horizontal 50 circuits modified accordingly.

Figure 3:
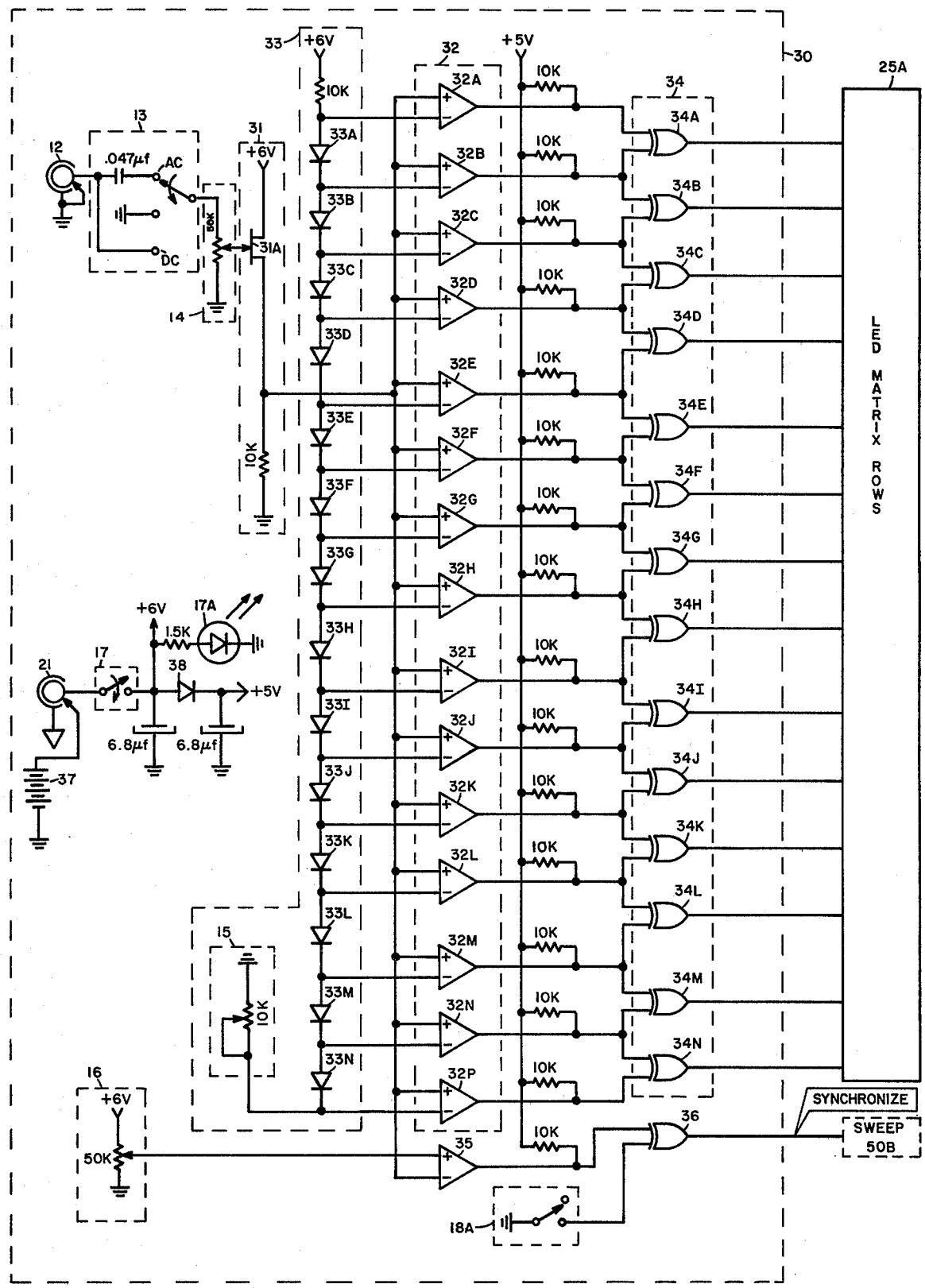
FIG. 3 is a schematic of the vertical circuitry.

FIG. 3 depicts the vertical circuit 30 (or row drive circuit) which converts the analog input signal to a "one-of-N" digital code where N corresponds to the number of rows of the LED matrix 25. In the following description N is equal to fourteen but only for illustrative purposes.

A signal whose waveform is to be observed is fed into the input jack 12. It is subjected to gain control by V.GAIN potentiometer 14, and, selectively, a blocking capacitor (AC/DC switch 13). After adjusting gain control, the signal is fed to an input buffer circuit 31, wherein the FET 31A could be a 2N3819 transistor. The output of the buffer circuit 31 drives sixteen comparators 32A-32P,35. Quad comparator integrated circuits LM339 can be used as comparators 32A-32P, 35. Fifteen of these comparators 32A-32P compare the buffered input signal against an array 33 of fifteen voltages spaced, for example, 0.3 volts apart wherein diodes 33A-33N are Germanium diodes 1N276. VPOS. potentiometer 15 varies the entire voltage array 33 relative to ground in order to effect control of the vertical position of the resultant trace. The output of the comparator array 32 forms a 15 bit word of format (000000111111111) where the transition from ZERO to ONE occurs in a position in the word proportional to the instantaneous value of the input. This 15 bit word is then sent through an array of 14 exclusive OR gates 34A-34N which drive the LED matrix rows 25A. The fourteen bit word that the OR gate array 34 produces is of the form (00000100000000) where the ONE position shifts in the word following the ZERO to ONE transition in the input word. Comparator 35 compares the buffered input voltage against a voltage from the SYNC control 16. This control 16 selects the synchronizing level at which sweep triggering occurs. The output of comparator 35 is also sent to an exclusive OR gate 36. The output of this gate 36 is the SYNCHRONIZE signal that goes to the sweep circuit 50B. The other input of the exclusive OR gate 36 is derived from panel switch 18A that selects the synchronizing polarity. The OR gates 34A-34N, 36 may be TTL7486 quad 2 input exclusive OR gates.

Power for the analyzer can be supplied by a battery 37 housed in the device or by an external source inputted through jack 21. Switch 17 turns the power to the analyzer OFF or ON. LED 17A can be used to indicate when the power is on. By using a voltage dropping diode 38 (such as 1N4003), +5 volts can be supplied to the TTL and CMOS logic used.

Figure 4:
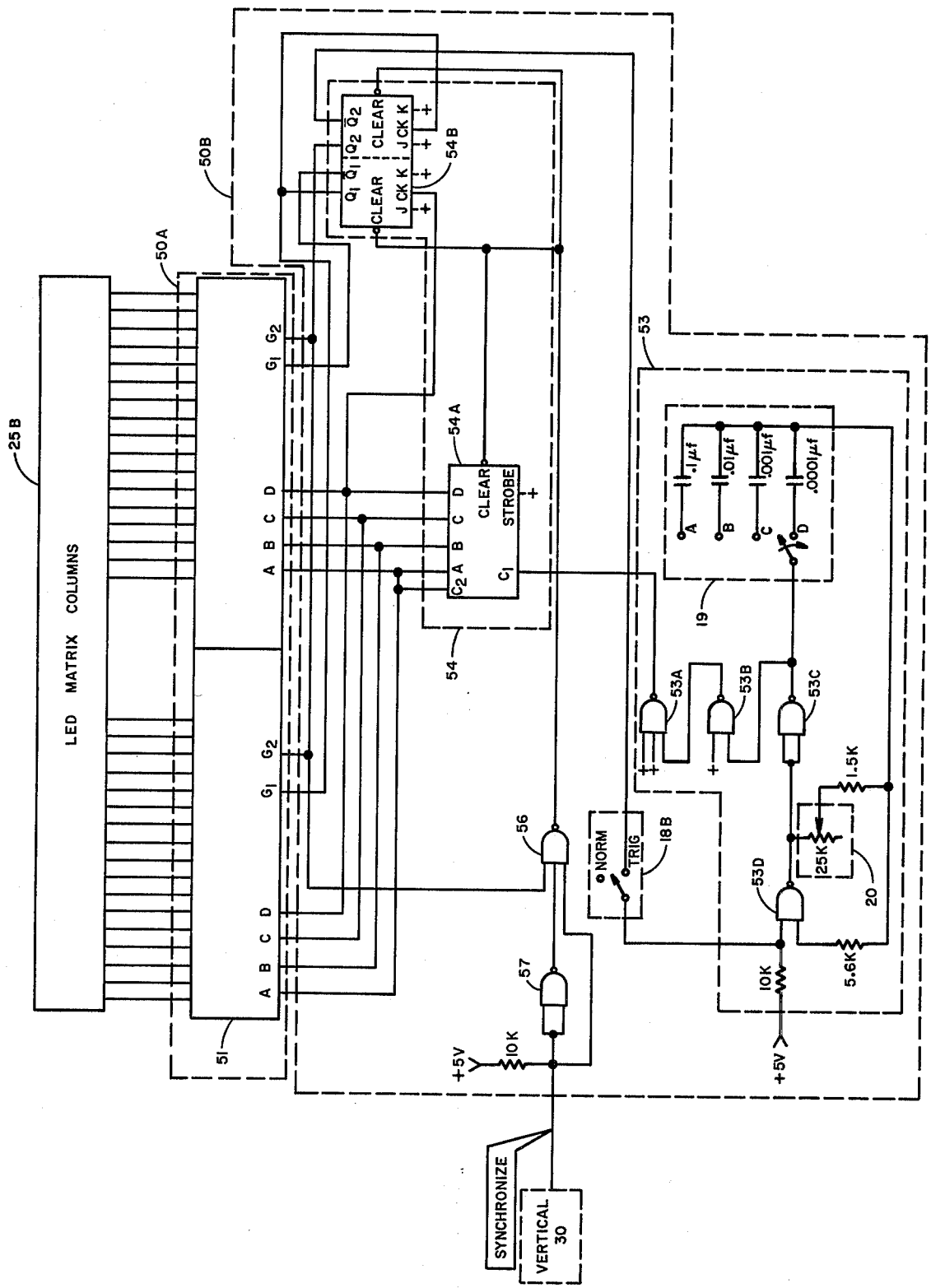
FIG. 4 is a schematic of the horizontal circuitry.

FIG. 4 shows the horizontal circuit 50 with a column drive circuit 50A and sweep circuit 50B. The column drive circuit 50A is a one-of-M decoder 51 (M=32 in the preferred embodiment) that simply grounds the $i$-th column where $i$ is a binary number in the 5 bit input word (A,B,C,D,G$_1$). Two TTL 74154 16 line decoders could be used for a decoder 51 which needs 32 outputs. The column drive circuit 50A drives the LED matrix columns 25B. The column drive circuit 50A also has an inhibit input signal to G$_2$ in decoder 51 which causes the trace to disappear.

Feeding the column drive circuit 50A is a sweep circuit 50B having a variable frequency clock oscillator 53 and a 6 bit counter 54. 4 bits could be supplied by TTL 8281 counter 54A and 2 bits by TTL 7473 dual flip-flop 54B. The triple input NAND gate 53A in oscillator 53 and enabling gate 56 can be TTL 7410 gates while the two-input NAND gates 53B, 53C, 53D, 57 could be CMOS 4011 gates.

The five least significant bits A,B,C,D,Q$_1$ of the counter 54 feed the 5 bit input word to the column drive circuit 50A. The sixth bit Q$_2$ of counter 54 blanks the trace by inhibiting the decoder 51 when Q$_2$ is ONE. When Q$_2$ is ONE, the SYNCHRONIZE signal can be processed. If the mode switch 18B is in TRIG position (closed) and bit Q$_2$ is ONE, the clock oscillator 53 is inhibited. The clock oscillator 53 operates continuously when mode switch 18B is in the NORM position (open).

The action of the sweep circuit 50B may be described as follows. In the TRIG position (mode switch 18B), the counter 54 counts clock pulses until the sixth bit Q$_2$ becomes ONE. When this happens, the SYNCHRONIZE signal is enabled. When the SYNCHRONIZE signal makes a positive transition, the enabling gate 56 and inverter 57 produce a very short spike that clears the six bit counter 54. With bits 1 through 5 set to (00000), the trace is decoded to the left most column and the sixth bit Q$_2$, which is also ZERO now, enables the display. As the contents of the counter 54 increases, the trace moves to the right until it reaches the right most column of the LED matrix 25B. With the next clock pulse, the sixth bit Q$_2$ becomes ONE again and the trace is again inhibited. During the sweep, the SYNCHRONIZE signal is blocked and the counter 54 cannot be reset. At the end of the trace, the sweep circuit is again waiting for a SYNCHRONIZE pulse. The speed of the trace is controlled entirely by the frequency of the oscillator 53 which, in turn, is controlled only by the settings of the SWEEP control 20 and the range control 19 labled A-B-C-D. The slowest range is the A setting on the range control 19.

The operation of the circuit 50B in NORM mode is similar to that of TRIG except that the clock is not stopped when a sweep is completed. As a result, the counter 54 continues to count during the time following a sweep, and in time, the trace inhibit bit Q$_2$ returns to the ZERO state and another sweep begins. If there are no pulses in the SYNCHRONIZE signal, the off-time of the trace equals the sweep time. If, however, SYNCHRONIZE pulse signals are present, then during the off-time, the first SYNCHRONIZE pulse will clear the counter 54 and begin another sweep resulting in a stable trace.

Obviously many modifications and variations of the present invention are possible in the light of the above teachings. It is therefore to be understood that within the scope of the appended claims the invention may be practiced otherwise than as specifically described.

What is claimed is:

1. A Digital Waveform Analyzer comprising:
   an input signal;
   a matrix of light emitting diodes wherein said LEDs are arranged in M columns and N rows;
   a vertical circuit which converts said input signal to a one-of-N digital code thereby driving said LED matrix rows and which compares said input signal against a select voltage to produce a synchronize signal;
   a horizontal circuit comprising:
      a column driving circuit outputting one-of-M code for driving said LED matrix columns; and,
      a sweep circuit comprised of:
         a variable frequency oscillator;
         a binary counter driven by said oscillator wherein the most significant bit of said counter is fed to said column driving circuit indicating if any LED column is to be illuminated, and wherein the remaining bits of said counter feed said column driving circuit indicating which, if any, LED column is to be illuminated; and,
         a synchronizing signal gate wherein said synchronize signal is gated with the most significant bit of said counter, said gate outputting a signal for clearing said counter and initiating a sweep; and
      power means for supplying power to said vertical and horizontal circuits.

2. The device of claim 1 wherein said sweep circuit includes a switching means which, when closed, inhibits oscillation in the absence of said synchronize signal and which, when open, allows said oscillator to be free running, said switch connected between said oscillator and the most significant bit of said counter.

3. The device of claim 1 wherein said vertical circuit comprises:
   means for providing a standard voltage array;
   a plurality of voltage comparators wherein said input signal is compared against said standard voltage array means and said comparators outputs indicate the instantaneous value of said input signal;
   means for converting said comparators outputs to a one-of-N digital code;
   a synchronizing level voltage means; and,
   a voltage comparator wherein said input signal is compared against the output of said synchronizing level voltage means and said comparator output is the synchronize signal.

4. The device of claim 3 wherein said sweep circuit includes
   a switching means which, when closed, inhibits oscillation in the absence of said synchronize signal and which, when open, allows said oscillator to be free running, said switch connected between said oscillator and the most significant bit of said counter.

5. The device of claim 3 including a gain control buffer means for accomodating said input signal amplitude.

6. The device of claim 5 wherein said sweep circuit includes
   a switching means which, when closed, inhibits oscillation in the absence of said synchronize signal and which, when open, allows said oscillator to be free running, said switch connected between said oscillator and the most significant bit of said counter.

* * * * *